United States Patent
Miyairi et al.

(10) Patent No.: US 6,797,626 B2
(45) Date of Patent: Sep. 28, 2004

(54) METHOD OF POLISHING COPPER LAYER OF SUBSTRATE

(75) Inventors: Noriko Miyairi, Nagano (JP); Yasuo Inada, Nagano (JP); Tsuyoshi Hasegawa, Nagano (JP); Yuji Terashima, Nagano (JP); Kenji Sakai, Nishikasugai-gun (JP); Tadahiro Kitamura, Nishikasugai-gun (JP); Takahiro Umeda, Nishikasugai-gun (JP)

(73) Assignees: Fujikoshi Machinery Corp., Nagano (JP); Fujimi Incorporated, Aichi (JP)

(*) Notice: Subject to any disclaimer, the term of this patent is extended or adjusted under 35 U.S.C. 154(b) by 0 days.

(21) Appl. No.: 10/331,070

(22) Filed: Dec. 27, 2002

(65) Prior Publication Data

US 2003/0124862 A1 Jul. 3, 2003

(30) Foreign Application Priority Data

Dec. 28, 2001 (JP) ........................ 2001-399130
Dec. 12, 2002 (JP) ........................ 2002-360423

(51) Int. Cl.⁷ ........................................... H01L 21/302
(52) U.S. Cl. ........................ 438/692; 438/693; 438/696; 438/700
(58) Field of Search ................. 438/691, 692, 438/693, 696, 698, 700

(56) References Cited

U.S. PATENT DOCUMENTS

| 5,391,258 A | 2/1995 | Brancaleoni et al. |
| 5,476,606 A | 12/1995 | Brancaleoni et al. |
| 5,575,885 A | 11/1996 | Hirabayashi et al. |
| 5,770,095 A | 6/1998 | Sasaki et al. |
| 5,858,813 A | 1/1999 | Scherber et al. |
| 5,954,997 A | 9/1999 | Kaufman et al. |
| 6,126,853 A | 10/2000 | Kaufman et al. |
| 6,194,317 B1 * | 2/2001 | Kaisaki et al. ............. 438/692 |
| 6,428,721 B1 | 8/2002 | Ina et al. |
| 6,440,186 B1 | 8/2002 | Sakai et al. |

FOREIGN PATENT DOCUMENTS

| JP | 7-233485 | 9/1995 |
| JP | 10-242289 | 9/1998 |
| JP | 2000-59014 | 2/2000 |

* cited by examiner

*Primary Examiner*—Nadine G. Norton
*Assistant Examiner*—Binh X. Tran
(74) *Attorney, Agent, or Firm*—Jordan and Hamburg LLP

(57) ABSTRACT

The method of polishing a copper layer of a substrate is capable of improving a stock removal rate, etc. The method comprises the steps of: supplying a substrate onto an polishing pad of an polishing plate with a copper layer facing the polishing pad; pressing the substrate onto the polishing pad, with a backing pad, by a press head; relatively rotating the press head with respect to the polishing plate, with supplying polishing slurry onto the polishing pad. The backing pad is made of a material whose Asker C hardness is 75–95 and whose compressibility is 10% or less. The polishing slurry includes a chelating agent for chelating copper, an etching agent for etching the surface of copper layer, an oxidizing agent for oxidizing the surface of copper layer, and water.

25 Claims, 3 Drawing Sheets

METHOD OF POLISHING COPPER LAYER OF SUBSTRATE

BACKGROUND OF THE INVENTION

The present invention relates to a method of polishing a copper layer of a substrate, e.g., a build-up substrate, used for example as a semiconductor wafer.

Some multi-layered circuit boards, on which electronic parts, e.g., semiconductor chips, etc. will be mounted, are made by a build-up method.

The build-up method will be explained.

Firstly, as shown in FIG. 9, an insulating resin layer 12 is formed on lower cable patterns 11, and then via-holes 13 are formed so as to expose a part of each lower cable pattern 11.

Next, as shown in FIG. 10, a copper layer 14 is formed in the via-holes 13 and a surface of the insulating resin layer 12 by non-electrolytic plating and electrolytic plating. In some cases, the copper layer 14 fills an inner space of each via-hole 13. The copper layer 14 formed by plating is apt to be thick in the vicinity of edges of the insulating resin layer 12. Therefore, parts of the copper layer 14 corresponding to the via-holes 13 are projected upward, so that flatness of the surface of the copper layer 14 must be low.

To make the surface of the copper layer 14 flat, firstly the surface of the copper layer 14 is removed by a roll-buff. Then, the copper layer 14 is etched to form into prescribed cable patterns (upper cable patterns). With this method, the upper cable patterns are electrically connected to the lower cable patterns 11. This method will be repeated prescribed times to form the multi-layered circuit board.

In the case of forming circuits on a semiconductor wafer, connecting terminals, e.g., copper bumps, are formed in the wafer after the circuits are formed therein. The copper bumps are formed by the steps of: forming a resist mask having opening sections, which correspond to the copper bumps, on the wafer; plating parts of circuit sections exposed in the opening sections with copper; and removing the resist mask. With this method, the copper bumps can be projected from the surface of the wafer. Note that, the wafer having the copper bumps will be cut and divided into a plurality of semiconductor chips. Each of the semiconductor chips will be electrically connected to a circuit board by the copper bumps as terminals.

In some cases, copper bumps are formed in a circuit board so as to electrically connect a semiconductor chip(s) to the circuit board.

However, the above described conventional methods have following disadvantages.

The roll-buff is made of hard abrasive grains, which are bound by binders and formed into a cylindrical shape. The roll-buff is rolled on the surface of the copper layer so as to remove the projected parts of the copper layer. The projections can be removed by the roll-buff, but waviness in a wide area cannot be removed by the roll-buff, so that it is difficult to form the copper layer having uniform thickness. Further, the surface of the copper layer is scratched by the roll-buff, so that reliability of an electric element must be lower.

On the other hand, height of the copper bumps must be equal so as to securely connect the copper bumps. It is desirable to remove the copper bumps to make their height equal, but there are no effective methods.

SUMMARY OF THE INVENTION

The present invention has been invented to solve the problems of the conventional methods.

An object of the present invention is to provide a method of polishing a copper layer of a substrate, which is capable of improving a stock removal rate, forming a copper layer having uniform thickness, restricting scratches on a surface of the copper layer, and forming copper bumps having equal height.

Namely, the method of the present invention comprises the steps of:

supplying a substrate having a copper layer onto a polishing pad on a polishing plate with the copper layer facing the polishing pad;

pressing the substrate onto the polishing pad, with a backing pad, by a press head;

relatively rotating the press head with respect to the polishing plate, with supplying polishing slurry onto the polishing pad, so as to polish the copper layer, wherein the backing pad is made of a material whose Asker C hardness is 75–95 and whose compressibility is 10% or less, and the polishing slurry includes a chelating agent for chelating copper, an etching agent for etching the surface of copper layer, an oxidizing agent for oxidizing the surface of copper layer, and water.

Copper bumps formed in the substrate can be effectively removed by the invention. Height of the copper bumps can be made equal, and the surface of the substrate can be uniformly polished.

Further, a copper layer formed in a build-up substrate can also be effectively polished by the invention.

In the method of the present invention, a hard and low compressible backing pad, whose Asker C hardness is 75–95 and compressibility is 10% or less, is used.

Therefore, the substrate is held by the press head and the backing pad contacts a back side of the substrate when the copper layer (a front side) of the substrate is polished.

In this case, if the backing pad is too soft, a pressing force applied to projections in the front side or a counter force from the polishing pad is transmitted to the backing pad and the backing pad is depressed by the projections. Namely, the parts of the substrate, which correspond to the projections, are buried in the backing pad, so that it is difficult to remove the projections in the front side of the substrate and the copper layer cannot be uniformly polished.

On the other hand, if the backing pad is too hard, e.g., Asker C hardness is 96–100, the back side of the substrate becomes a standard face for the polishing. If there are small projections in the back side of the substrate, the projections are not buried in the backing pad, so that the projections badly influence the polishing. Uniformity of the polished copper layer must consequently be lower.

In the method of the present invention, the backing pad has the prescribed hardness and compressibility, so that projections in the back side of the substrate can be removed by the backing pad, and the backing pad is not badly influenced by projections in the copper layer. Therefore, the copper layer can be polished uniformly, and the copper layer having uniform thickness can be produced.

In the method, the backing pad may be made of polyurethane foam.

Further, the polishing slurry used in the method is capable of increasing the stock removal rate without scratching the surface of the copper layer, so that manufacturing efficiency can be improved. Namely, the polishing slurry includes a chelating agent for chelating copper, an etching agent for etching the surface of the copper layer, an oxidizing agent for oxidizing the surface of the copper layer, and water. The copper layer is chemically etched by the etching agent.

The chelating agent catches copper grains, which are removed and separated by the etching agent and the abrasive grains in the case of the polishing slurry includes abrasive grains, and acts as the accelerator of the polishing.

Further, the chelating agent prevents the surface of the copper layer from being scratched by copper grains, so that no surface defects are formed on the surface of the copper layer.

In the method, the chelating agent may be organic carboxylic acid. For example, it may be at least one selected from the group consisting of: amino acid; quinoline-2-carboxylic acid (quinaldic acid); 2-pyridine carboxylic acid; 6-pyridine carboxylic acid; and quinine. Preferably, amino acid is selected due to good environmental conditions and high stock removal rate. Further, the chelating agent may be at least one amino acid selected from the group consisting of: neutral amino acid, such as glycine, $\alpha$-alanine, -alanine, valine, leucine, L-isoleucine, D-isoleucine, L-alloisoleucine, D-alloisoleucine, serine, L-threonine, D-threonine, L-allothreonine, D-allothreonine, cysteine, methionine, phenylalanine, tryptophan, tyrosine, proline, cystine; and basic amino acid, such as lysine, arginine, histidine. Especially, the preferable chelating agent is at least one selected from the group consisting of: glycine, $\alpha$-alanine and -alanine due to high stock removal rate.

Amount of the chelating agent in the slurry should be 0.015–2.5 mol/l. If it is less than 0.015 mol/l, the stock removal rate must be low; if it is more than 2.5 mol/l, some chelating agents are deposited. Attention is highly required.

Preferable amount of the chelating agent in the slurry is 0.03–2.0 mol/l; further preferably, 0.05–1.8 mol/l.

The etching agent chemically etches the surface of the copper layer. It further accelerates the mechanical polishing, in which the slurry including abrasive grains is used.

Whatever materials which have an etching force against copper may be used.

Copper can be etched by an acid etching agent and an alkaline etching agent. Preferably, the etching agent is at least one selected from the group consisting of: ammonia; and ammonium salt due to synergism with the oxidizing agent. For example, the ammonium salt is at least one selected from the group consisting of: inorganic ammonium salts, e.g., ammonium carbonate, ammonium hydrogen carbonate, ammonium phosphate, ammonium nitrate, ammonium sulfate, ammonium chloride; and organic ammonium salts, e.g., ammonium lactate, ammonium citrate, ammonium malate, ammonium oxalate. Preferably, ammonium carbonate is selected due to good environmental conditions and high stock removal rate.

Amount of the etching agent should be 5–25 wt % of the polishing slurry. If it is less than 5 wt %, the stock removal rate is too low; if it is more than 25 wt %, some etching agents are deposited. Attention is highly required.

Preferable amount of the etching agent of the polishing slurry is 10–25 wt %, further preferably, 15–25 wt %.

The etching agent may be added with high density, and it may be diluted when it is used. In the case of using ammonia (ammonia water) as the etching agent, preferably it is added immediately before the use due to stability of the polishing slurry.

The oxidizing agent chemically oxidizes the surface of the copper layer. The chelating agent works to the oxidized copper layer, and in the case of the polishing slurry includes abrasive grains, the abrasive grains mechanically works thereto, so that the polishing is further accelerated. Namely, the oxidizing agent accelerates the polishing with the abrasive grains.

Note that, the preferable oxidizing agent is hydrogen peroxide water due to oxidizing force and cost.

Amount of the oxidizing agent should be 0.1–10 wt % of the slurry. If it is less than 0.1 wt %, the stock removal rate is too low; if it is more than 10 wt %, a container for storing the polishing slurry is expanded and stability of the polishing slurry is low.

Preferable amount of the oxidizing agent of the polishing slurry is 0.5–8 wt %, further preferably, 1–5 wt %.

The oxidizing agent of high density may be prepared, and it may be diluted with a solvent when it is used. Preferably, the oxidizing agent is added immediately before the use due to stability of the polishing slurry and prevention of natural dissolution.

The water is used for dispersing and dissolving the agents. Preferably, the water is ion-exchanged water, which has been filtered to remove impurities, or distilled water.

A pH value of the polishing slurry should be 7–10. If it is less than 7, the stock removal rate is too low; if it is more than 10, the slurry is formed into gel and the surface of the copper layer is made rough.

In the method of the present invention, the polishing slurry may include abrasive grains which are made of at least one selected from the group consisting of: silicon dioxide; aluminum oxide; cerium oxide; titanium oxide; silicon nitride; and zirconium oxide, and amount of the abrasive grains may be 0.1–50 wt % of the polishing slurry.

In the case of the polishing slurry includes abrasive grains, the copper layer can be mechanically removed, too. Surface roughness of the polished copper layer can be improved, and further precise polishing can be executed. By the mechanical polishing, the amount of the etching agent can be reduced, so that influences of the chemical polishing can be reduced. Therefore, the surface roughness of the polished copper layer can be improved.

If the amount of the abrasive grain is less than 0.1 wt %, the surface of the copper layer is made rough; if it is more than 50 wt %, mixture and dissolution of other agents are difficult. Preferable amount of the abrasive grains is 0.5–40 wt %, more preferably, 1–35 wt %.

Note that, a preferable material of the abrasive grains is silicon dioxide, and more preferably, colloidal silica.

Average diameter of the abrasive grains will be explained. In the case of the abrasive grains made of silicon dioxide, the preferable average diameter is 10–300 nm (measured by BET method), more preferably 30–100 nm. In the case of the abrasive grains made of cerium oxide, the preferable average diameter is 0.01–0.5 $\mu$m (observed by a scanning electron microscope), more preferably 0.05–0.45 $\mu$m. In the case of the abrasive grains made of other materials, the preferable average diameter is 0.01–2 $\mu$m (measured by a laser diffraction particle size analyzer LS-230 manufactured by Coulter Inc., USA), more preferably 0.05–1.5 $\mu$m.

As described above, undiluted solutions of said agents may be prepared with high density, and they may be mixed with proper rates and properly diluted by the water. In this manner, they can be easily and effectively stored and transported. Further, a high density mixture, which includes the chelating agent, water and the abrasive grains (in the case of the polishing slurry includes abrasive grains), may be previously prepared, and the etching agent (in the case of using ammonia water) and the oxidizing agent may be added, with prescribed rate, to the mixture, then the mixture may be further diluted with water so as to use as the polishing slurry.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings.

Figure 1:
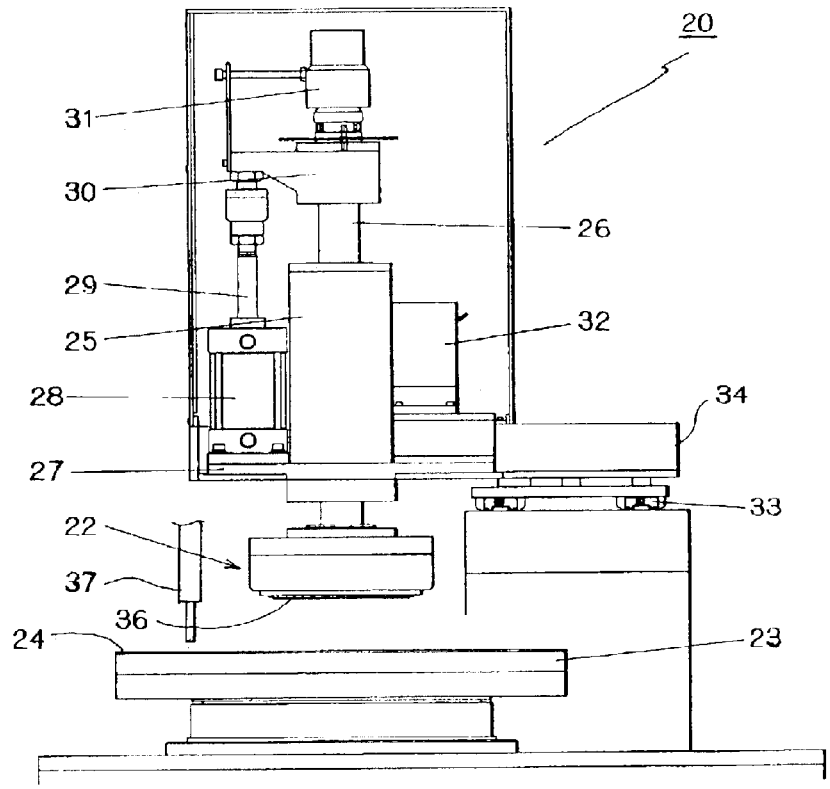
FIG. 1 is a front view of an polishing machine.
Figure 2:
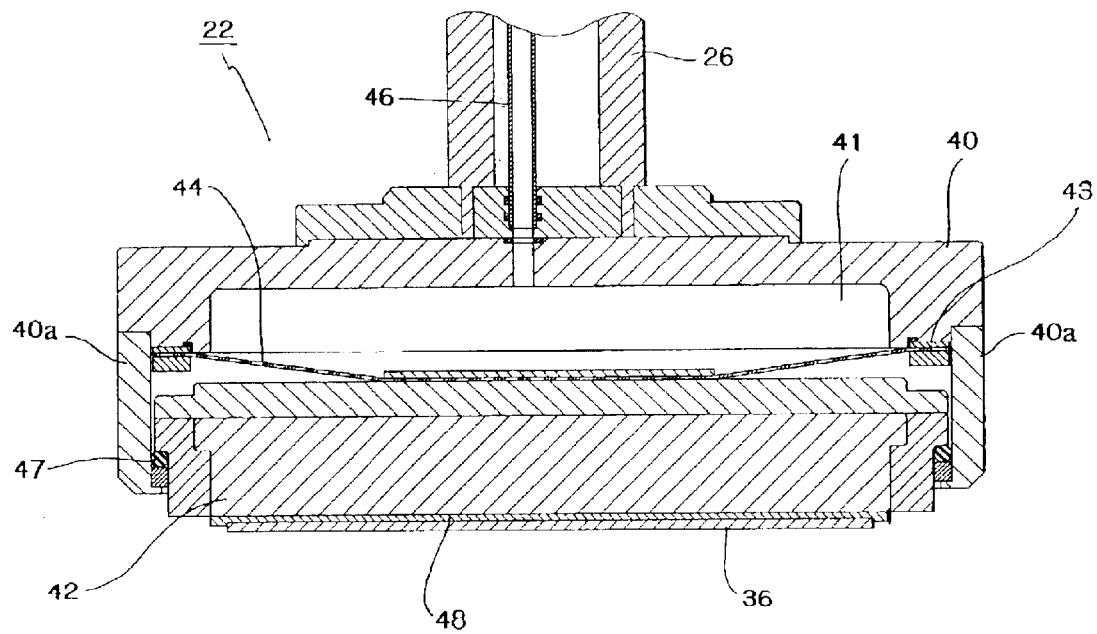
FIG. 2 is a partial sectional view of a press head.
Figure 9:
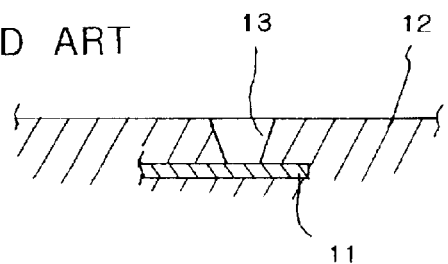
FIG. 9 is an explanation view of a substrate, in which a via-hole is formed.
Figure 10:
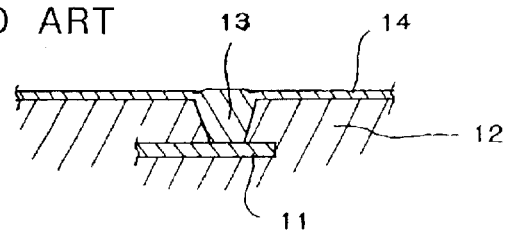
FIG. 10 is an explanation view of the substrate, on which a copper layer is formed.

FIG. 1 is a front view of a polishing machine 20, and FIG. 2 is a partial sectional view of a press head 22.

A polishing pad 24, which is made of, for example, polyurethane foam, a hard nonwoven fabric, is adhered on an upper face of a polishing plate 23.

Shallow grooves (not shown), which are mutually crossed like a grid, or small holes (not shown) may be formed in an upper face of the polishing pad 24. For example, a polishing pad SUBA800 (D52), which is manufactured by Rodel Nitta Company and whose grid size of the shallow grooves is 20 mm×20 mm, may be used as the polishing pad 24 as well as a polishing machine for polishing silicon wafers.

The polishing plate 23 is rotated about a rotary shaft (not shown), by a known driving mechanism (not shown), in a horizontal plane.

The press head 22 is fixed at a lower end of a shaft 26, which can be rotated about its own axis, and rotated together with the shaft 26. The shaft 26 is pierced through a block 25, which is provided on an arm 27, and capable of moving in the vertical direction.

A cylinder unit 28 is provided on the arm 27. A supporting block 30 is fixed at an upper end of a cylinder rod 29 of the cylinder unit 28. The shaft 26 is rotatably held by the supporting block 30. A rotary joint 31 is connected to an upper end of the shaft 26.

A rotary cylinder (not shown), in which a gear is provided on an outer circumferential face, is provided in the block 25, and the shaft 26 is pierced through the rotary cylinder and capable of moving in the vertical direction. The rotary cylinder is connected with the shaft 26 by a key (not shown) and a key groove (not shown).

The shaft 26 can be freely moved in the vertical direction with respect to the rotary cylinder, but the shaft 26 is compulsorily rotated if the rotary cylinder is rotated about its own axis. A motor 32 is provided on the arm 27. A gear (not shown) is fixed to a motor shaft of the motor 32 and engaged with the gear of the rotary cylinder.

The arm 27 is fixed on a movable table 34, which is moved along rails 33.

A substrate 36 to be polished is held on a bottom face of the press head 22.

Polishing slurry is supplied by a nozzle 37.

When the movable table 34 is moved along the rails 33 by a driving mechanism (not shown), the press head 33 holding the substrate 36 is moved between a first position, which is outside of the polishing plate 23, and a second position, which is above the polishing plate 23.

By moving the cylinder rod 29 of the cylinder unit 28 downward, the press head 22 is also moved downward, so that the substrate 36 contacts the polishing pad 24 of the polishing plate 23. Further, the substrate 36 is pressed onto the polishing pad 24, by a press mechanism (described later), with prescribed pressure, and the slurry is supplied onto the polishing pad 24 from the nozzle 37. The polishing plate 23 and the press head 23 are respectively rotated about their own axes, so that the substrate 36 can be polished.

The press head 22 will be explained in detail with reference to FIG. 2.

A sectional shape of a body proper 40 of the press head 22 is formed into an inverted U-shape. A bottom face is opened, and a space 41 is formed in the body proper 40. Symbols 40a indicate side wall sections of the body proper 40.

A plate 42, which is made of, for example, ceramic, is provided in a lower part of the body proper 40 so as to close the space 41. A diaphragm 44, which is made of an elastic sheet, e.g., a rubber sheet, is fixed on an upper face of the plate 42. An outer edge of the diaphragm 44 is fixed to a bottom face of a step section 43. With this structure, the plate 42 is suspended by the diaphragm 44. Further, the space 41 in the body proper 40 is divided by the diaphragm 44.

Compressed air is supplied into the space 41 via an air tube 46 provided in the shaft 26. The compressed air is introduced to the air tube 46 from air supplying means (not shown), e.g., a compressor, via the rotary joint 31.

An O-ring 47 is provided between a step section formed on an outer circumferential face of the plate 42 and step sections formed in lower parts of the side wall sections 40a.

A backing pad 48 is exchangeably adhered on a bottom face of the plate 42 by, for example, an adhesive (not shown). Asker C hardness of the backing pad 48 is 75–95, and compressibility thereof is 10% or less. For example, a backing pad BP201 (compressibility 3.4%, compression elasticity 75%, Asker C hardness 84), which is manufactured by Fujiboseki Inc., may be used as the backing pad 48. Further, polyurethane foam may be used as the backing pad 48.

A back side (an upper face) of the substrate 36 contacts a bottom face of the backing pad 48, and the substrate 36 is held by the backing pad 48. The substrate 36 is pressed onto the backing pad 48 including water so as to purge air left between the substrate 36 and the backing pad 48. By purging the air, negative pressure is produced between the substrate 36 and the backing pad 48, so that the substrate 36 can be held on the bottom face of the backing pad 48. Preferably, a retainer ring (not shown), whose lower end is slightly projected downward from a lower end of the backing pad 48, is provided on an outer circumferential face of the backing pad 48. By providing the retainer ring, the substrate 36 never springs out during the polishing. The retainer ring presses the polishing pad 24 of a periphery of the substrate 36, so that the upper face of the backing pad 48 is depressed and its level is made equal to that of a lower face (a front side) of the substrate 36. With this function, over polishing of an edge of the substrate 36 can be prevented.

By supplying the compressed air in the space 41 via the air tube 46, the plate 42 and the substrate 36 held by the backing pad 48 can be pressed onto the polishing pad 24 with a prescribed force so as to polish the lower face of the substrate 36.

Next, an ordinary process of manufacturing a build-up substrate will be explained with reference to FIGS. 3–7.

Figure 3:
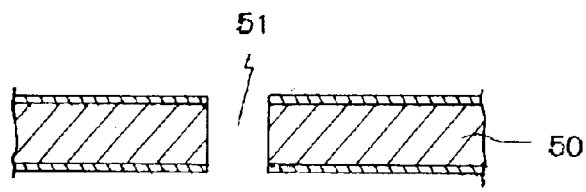
FIG. 3 is an explanation view of a substrate, in which a through-hole is formed.

Firstly, as shown in FIG. 3, a plurality of through-holes 51 (one of the through-holes is shown) are formed in a core substrate 50, e.g., a plastic substrate including glass-cloth, whose both sides are covered with copper films by a drill or laser means. The through-holes 51 are arranged in a prescribed pattern.

Figure 4:
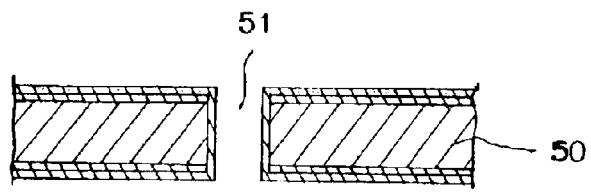
FIG. 4 is an explanation view of the substrate, in which a plated film is formed in the through-hole.

Then, copper layers are formed on the copper films and inner faces of the through-holes 51 by non-electrolytic copper plating and electrolytic copper plating (see FIG. 4).

Figure 5:
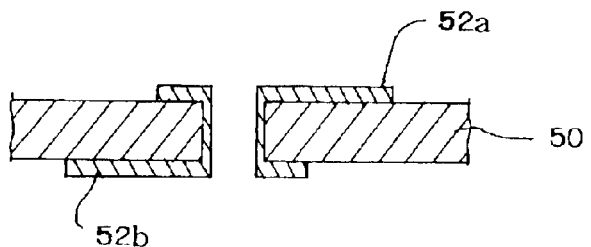
FIG. 5 is an explanation view of the substrate, on which cable patterns are formed.

The copper layers are etched so as to form cable patterns 52a and 52b on the both faces of the core substrate 50 (see FIG. 5).

Figure 6:
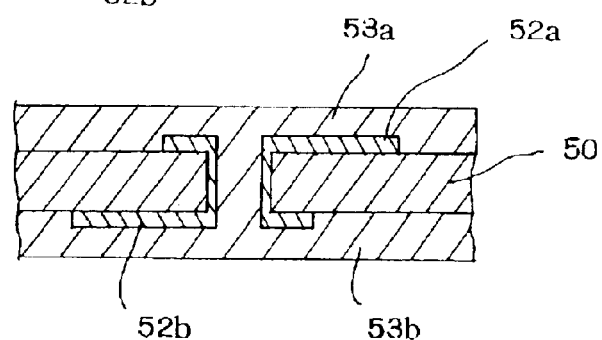
FIG. 6 is an explanation view of the substrate, on which an insulating resin layer is formed.

Resin is applied to the both faces of the core substrate 50 so as to cover the cable patterns 52a and 52, so that insulating resin layers 53a and 53b are formed (see FIG. 6). In some cases, surfaces of the insulating resin layers 53a and 53b may be polished to make flat. This polishing may be executed by the polishing machine shown in FIG. 1 with supplying proper polishing slurry.

Figure 7:
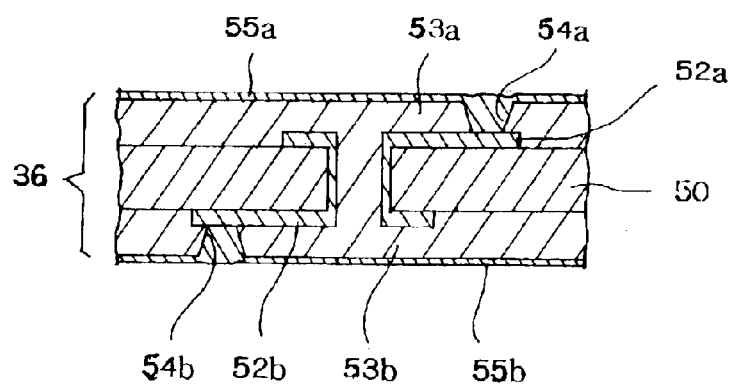
FIG. 7 is an explanation view of the substrate, in which a via-hole and a copper layer are formed.

Then, as shown in FIG. 7, via-holes 54a and 54b are formed so as to partially expose the cable patterns 52a and 52b. If the insulating resin layers 53a and 53b are made of photosensitive resin, the via-holes 54a and 54b can be formed by exposing and developing treatments; if the insulating resin layers 53a and 53b are made of non-photosensitive resin, they can be formed by, for example, laser means. Copper layers 55a and 55b are formed in the via-holes 54a and 54b and on the insulating resin layers 53a and 53b. In some cases, the via-holes 54a and 54b may be filled with copper.

In the present embodiment, the copper layers 55a and 55b of the substrate is polished to make flat. Firstly, the copper layer 55a is polished, then the substrate is inverted to polish the other copper layer 55b. After the copper layers 55a and 55b are made flat, they are etched to make cable patterns. The above described process is repeated prescribed times to form a multi-layered build-up substrate.

In the above described embodiment, the broad copper layers 55a and 55b are polished; in another embodiment, copper bumps are polished.

Figure 8:
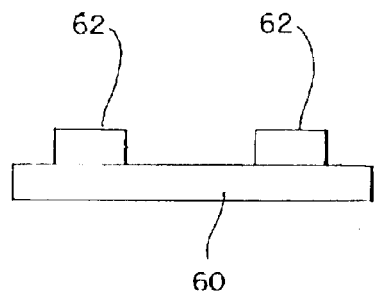
FIG. 8 is an explanation view of a substrate, in which copper bumps are formed.

In FIG. 8, copper bumps 62, which act as connecting terminals, are formed in a substrate 60, e.g., a silicon wafer.

The copper bumps 62 are made by the steps of: forming a resist mask having opening sections, which correspond to the copper bumps 62, on the wafer 60; plating parts of circuit sections exposed in the opening sections with copper; and removing the resist mask. With this method, the copper bumps 62 can be projected from the surface of the wafer 60.

By the method of the present invention, copper bumps formed on a circuit board (a substrate) can be removed. The substrate is not limited to the plastic substrate; ceramic substrates, glass substrates, etc. can be polished.

Results of experiments and comparative examples will be explained.

Experiment 1

Copper layers of substrates were polished by the polishing machine shown in FIGS. 1 and 2 under following conditions:

1. Polishing slurry

Abrasive grains: colloidal silica,
average grain diameter 35 nm, 10 wt %

Chelating agent: glycine, 0.5 mol/l

Etching agent: ammonia water (density 30%), 1 wt %

Oxidizing agent: hydrogen peroxide water (density 31%), 3 wt %

Water: distilled water

2. Backing pad

BP201: Fujiboseki Inc., compressibility 3.4% Asker C hardness 84

3. Polishing pad

SUBA800 (D52): Rodel Nitta Company,
grid size 20 mm×20 mm

4. Pressure for polishing: 35.316 kPa

5. Rotational speed of polishing plate: 70 rpm 10 samples were polished, and the results were as follows:

Stock removal rate: 8–9 $\mu$m/min.

(target: 10 $\mu$m/min. or more)

Uniformity polished layer: 0.15–0.47 $\mu$m (target: 0.75 $\mu$m or less)

Average surface roughness (Ra): 0.05–0.19 $\mu$m (target: 0.5 $\mu$m or less)

Note that, the uniformity of polished layer means uniformity of thickness of the copper layer, and it is standard deviation (1$\sigma$) of thickness of the copper layer measured at a center and eight points near edges.

The average surface roughness (Ra) means roughness of the surface of the copper layer measured by the noncontacting measuring instrument.

The stock removal rate was slightly less than the target, but the uniformity of the polished layer and the average surface roughness were sufficient.

Experiment 2

Copper layers of substrates were polished by the polishing machine shown in FIGS. 1 and 2. Only the polishing slurry was changed as follows:

1. Polishing slurry

Chelating agent: glycine, 0.7 mol/l

Etching agent: ammonia water (density 30%), 1.25 wt %

Oxidizing agent: hydrogen peroxide water (density 31%), 3 wt %

Water: distilled water 10 samples were polished, the uniformity of the polished layer was appraised as well as Experiment 1, and the results were as follows:

Stock removal rate: 8–9 $\mu$m/min.

(target: 10 $\mu$m/min. or more)

Uniformity of polished layer: 0.18–0.48 $\mu$m (target: 0.75 $\mu$m or less)

Average surface roughness (Ra): 0.07–0.24 $\mu$m (target: 0.5 $\mu$m or less)

The stock removal rate was slightly less than the target, but the uniformity of the polished layer and the average surface roughness were sufficient as well as Experiment 1. These were measured as well as Experiment 1.

Experiment 3

Copper layers of substrates were polished by the polishing machine shown in FIGS. 1 and 2 under following conditions:
1. Polishing slurry
Abrasive grains: colloidal silica,
   average grain diameter 35 nm, 10 wt %
Chelating agent: glycine, 0.04 mol/l
Etching agent: ammonium carbonate, 6.5 wt %
Oxidizing agent: hydrogen peroxide water (density 31%), 3 wt %
Water: distilled water
2. Backing pad
BP201: Fujiboseki Inc., compressibility 3.4% Asker C hardness 84
3. Polishing pad
SUBA800 (D52+H5): Rodel Nitta Company,
   grid size 20 mm×20 mm
   hole diameter 5 mm
4. Polishing pressure: 35.316 kPa
5. Rotational speed of polishing plate: 110 rpm
10 samples were polished, and the results were as follows:
Stock removal rate: 10–12 µm/min.
(target: 10 µm/min. or more)
Uniformity polished layer: 0.45–0.50 µm
(target: 0.75 µm or less)
Average surface roughness (Ra): 0.07–0.24 µm
(target: 0.51 µm or less)
Note that, the uniformity of polished layer is standard deviation (1σ) of thickness of the copper layer evenly measured at 25 points.

The average surface roughness was measured by the noncontacting measuring instrument as well as Experiment 1 and 2.

The stock removal rate was slightly greater than the target and the uniformity of the polished layer and the average surface roughness were sufficient.

Experiment 4

Copper layers of substrates were polished by the polishing machine shown in FIGS. 1 and 2 as well as Experiment 3. Only the polishing slurry was changed as follows:
1. Polishing slurry
Chelating agent: glycine, 0.07 mol/l
Etching agent: ammonium carbonate, 8 wt %
Oxidizing agent: hydrogen peroxide water (density 31%), 3 wt %
Water: distilled water
10 samples were polished, and the results were as follows:
Stock removal rate: 12–15 µm/min.
(target: 10 µm/min. or more)
Uniformity polished layer: 0.23–0.6 µm
(target: 0.75 µm or less)
Average surface roughness (Ra): 0.09–0.30 µm
(target: 0.5 µm or less)
The stock removal rate, the uniformity of the polished layer and the average surface roughness were highly sufficient. These were measured as well as Experiment 1.

Experiment 5

Copper bumps of substrates were polished by the polishing machine shown in FIGS. 1 and 2 under following conditions:
1. Polishing slurry
Abrasive grains: colloidal silica,
   average grain diameter 35 nm, 10 wt %
Chelating agent: glycine, 0.04 mol/l
Etching agent: ammonium carbonate, 6.5 wt %
Oxidizing agent: hydrogen peroxide water (density 31%), 3 wt %
Water: distilled water
2. Backing pad
BP201: Fujiboseki Inc., compressibility 3.4% Asker C hardness 84
3. Polishing pad
IC1000: Rodel Nitta Company,
4. Polishing pressure: 3.43 kPa
5. Rotational speed of polishing plate: 7 rpm
10 samples were polished, and the results were as follows:
Stock removal rate: 5–10 µm/min.
Uniformity polished layer: 0.3–0.5 µm
(target: 1 µm or less)
Note that, in each substrate, nine copper bumps were formed at a center and at mid portions and outermost portions of four virtual lines radically extended from the center with regular angular separations. Height of the nine copper bumps of each substrate was measured. A difference between the highest bump and the lowest bump was calculated for each substrate. Thus, in the present experiment, a scattering range of said differences of 10 samples is considered as the uniformity of height of the polished copper bumps.

The stock removal rate and the uniformity of height were highly sufficient.

Note that, in Experiments 1–5, no scratches were observed in the polished surfaces of any copper layers and bumps.

Comparative Example 1

Copper layers of substrates were polished by the polishing machine shown in FIG. 1 under following conditions:
1. Polishing slurry
CMP slurry PLANERLITE-7101: Fujimi Inc.,
2. Backing pad
BP102: Fujiboseki Inc.,
   compressibility 18.8%, Asker C hardness 71
3. Polishing pad
SUBA800 (D52): Rodel Nitta Company,
   grid size 20 mm×20 mm
4. Polishing pressure: 35.316 kPa
5. Rotational speed of polishing plate: 70 rpm
10 samples were abraded, and the results were as follows:
Stock removal rate: 0.45–0.50 µm/min.
(target: 10 µm/min. or more) Uniformity polished layer: 0.60–1.88 µm
(target: 0.75 µm or less) Average surface roughness (Ra): 0.06–0.10 µm
(target: 0.5 µm or less)
The uniformity of polished layer and the average surface roughness were measured as well as Experiment 1.

The results were much lower than the targets and insufficient.

Comparative Example 2

Copper bumps of substrates were polished by the polishing machine shown in FIG. 1 under following conditions:
1. Polishing slurry
POLIPLA-103: Fujimi Inc.,
2. Backing pad
BP201: Fujiboseki Inc.
3. Polishing pad
IC1000: Rodel Nitta Company,
4. Polishing pressure: 3.43 kPa
5. Rotational speed of polishing plate: 7 rpm 10 samples were polished, the uniformity of height was appraised as well as Experiment 5, and the results were as follows:
Stock removal rate: 1–3 µm/min.
Uniformity polished layer: 0.60–1.88 µm
The results were insufficient.

The invention may be embodied in other specific forms without departing from the spirit or essential characteristics thereof. The present embodiments are therefore to be considered in all respects as illustrative and not restrictive, the scope of the invention being indicated by the appended claims rather than by he foregoing description and all changes which come within the meaning and range of equivalency of the claims are therefore intended to be embraced therein.

What is claimed is:

1. A method of polishing a copper layer of a substrate, comprising the steps of:
   supplying the substrate onto an polishing pad of a polishing plate with the copper layer facing the polishing pad;
   pressing the substrate onto the polishing pad, with a backing pad, by a press head;
   relatively rotating the press head with respect to the polishing plate, with supplying polishing slurry onto the polishing pad, so as to polish the copper layer,
   wherein said backing pad is made of a material having an Asker C hardness of about 75–95 and a compressibility no greater than about 10%, and
   said polishing slurry includes a chelating agent for chelating copper, an etching agent for etching the surface of the copper layer, an oxidizing agent for oxidizing the surface of the copper layer, and water.

2. The method according to claim 1,
   wherein said copper layer is a copper bump formed in the substrate.

3. The method according to claim 1,
   wherein said substrate is a build-up substrate.

4. The method according to claim 1,
   wherein said backing pad is made of polyurethane foam.

5. The method according to claim 1,
   wherein said chelating agent is organic carboxylic acid.

6. The method according to claim 1,
   wherein said chelating agent is at least one organic carboxylic acid selected from the group consisting of: amino acid comprising neutral amino acid and/or basic amino acid; quinoline-2-carboxylic acid (quinaldic acid); 2-pyridine carboxylic acid; 6-pyridine carboxylic acid; and quinine,
   said neutral amino acid is at least one selected from the group consisting of: glycine; α-alanine; β-alanine; valine; leucine; L-isoleucine; D-isoleucine; L-alloisoleucine; D-alloisoleucine; serine; L-threonine; D-threonine; L-allothreonine; D-allothreonine; cysteine; methionine; phenylalanine; tryptophan; tyrosine; proline; and cystine, and
   said basic amino acid is at least one selected from the group consisting of: lysine; arginine; and histidine.

7. The method according to claim 1,
   wherein said etching agent is an alkaline compound.

8. The method according to claim 1,
   wherein said etching agent is at least one selected from the group consisting of: ammonia; and ammonium salt of inorganic acid or organic acid.

9. The method according to claim 1,
   wherein said oxidizing agent is hydrogen peroxide water.

10. The method according to claim 1,
    wherein amount of said chelating agent in said polishing slurry is 0.015–2.5 mol/l;
    amount of said etching agent is 5–25 wt % of said polishing slurry; and
    amount of said oxidizing agent is 0.1–10 wt % of said polishing slurry.

11. The method according to claim 1, wherein pH of said polishing slurry is 7–10.

12. The method according to claim 1,
    wherein said etching agent and said oxidizing agent are mixed immediately before using said polishing slurry.

13. The method according to claim 1,
    wherein said polishing slurry includes abrasive grains which are made of at least one selected from the group consisting of: silicon dioxide; aluminum oxide; cerium oxide; titanium oxide; silicon nitride; and zirconium oxide.

14. The method according to claim 13,
    wherein said copper layer is a copper bump formed in the substrate.

15. The method according to claim 13,
    wherein said substrate is a build-up substrate.

16. The method according to claim 13,
    wherein said backing pad is made of polyurethane foam.

17. The method according to claim 13,
    wherein said chelating agent is organic carboxylic acid.

18. The method according to claim 13,
    wherein said chelating agent is at least one organic carboxylic acid selected from the group consisting of: amino acid comprising neutral amino acid and/or basic amino acid; quinoline-2-carboxylic acid (quinaldic acid); 2-pyridine carboxylic acid; 6-pyridine carboxylic acid; and quinine,
    said neutral amino acid is at least one selected from the group consisting of: glycine; α-alanine; β-alanine; valine; leucine; L-isoleucine; D-isoleucine; L-alloisoleucine; D-alloisoleucine; serine; L-threonine; D-threonine; L-allothreonine; D-allothreonine; cysteine; methionine; phenylalanine; tryptophan; tyrosine; proline; and cystine, and
    said basic amino acid is at least one selected from the group consisting of: lysine; arginine; and histidine.

19. The method according to claim 13,
    wherein said etching agent is an alkaline compound.

20. The method according to claim 13,
    wherein said etching agent is at least one selected from the group consisting of: ammonia; and ammonium salt of inorganic acid or organic acid.

21. The method according to claim 13,
    wherein said oxidizing agent is hydrogen peroxide water.

22. The method according to claim 13,
wherein amount of said chelating agent in said polishing slurry is 0.015–2.5 mol/l;
amount of said etching agent is 5–25 wt % of said polishing slurry; and
amount of said oxidizing agent is 0.1–10 wt % of said polishing slurry.

23. The method according to claim 13,
wherein pH of said polishing slurry is 7–10.

24. The method according to claim 13,
wherein said etching agent and said oxidizing agent are mixed immediately before using said polishing slurry.

25. A method of polishing a copper layer of a substrate, comprising the steps of:
supplying the substrate onto an polishing pad of a polishing plate with the copper layer facing the polishing pad;
pressing the substrate onto the polishing pad, with a backing pad, by a press head;
relatively rotating the press head with respect to the polishing plate, with supplying polishing slurry onto the polishing pad, so as to polish the copper layer, wherein:
said substrate is an insulating plastic substrate,
said copper layer is of relatively broadened expanse, formed on a surface of the insulating plastic substrate by executing non-electrolytic plating, followed by executing electrolytic plating,
said backing pad is made of a material having an Asker C hardness of about 75–95 and a compressibility no greater than about 10%, and
said polishing slurry includes a chelating agent for chelating copper, an etching agent for etching the surface of the copper layer, an oxidizing agent for oxidizing the surface of the copper layer, and water.

* * * * *